United States Patent
Ishikuri

(10) Patent No.: US 9,240,231 B2
(45) Date of Patent: Jan. 19, 2016

(54) RECORDING APPARATUS AND CONTROL METHOD FOR RECORDING APPARATUS

(71) Applicant: CANON KABUSHIKI KAISHA, Tokyo (JP)

(72) Inventor: Ryuichi Ishikuri, Kawasaki (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/598,556

(22) Filed: Jan. 16, 2015

(65) Prior Publication Data

US 2015/0213874 A1 Jul. 30, 2015

(30) Foreign Application Priority Data

Jan. 27, 2014 (JP) ................................ 2014-012763

(51) Int. Cl.
  *G11C 7/22* (2006.01)
  *G11C 11/4076* (2006.01)

(52) U.S. Cl.
  CPC ............ *G11C 11/4076* (2013.01); *G11C 7/222* (2013.01)

(58) Field of Classification Search
  CPC ...................................................... G11C 7/222
  USPC ................................................. 365/194, 201
  See application file for complete search history.

(56) References Cited

U.S. PATENT DOCUMENTS

| 2006/0140045 A1* | 6/2006 | Kishimoto | G11C 7/1051 365/194 |
| 2008/0247261 A1* | 10/2008 | Ishikawa | G11C 7/1045 365/230.08 |
| 2015/0058705 A1* | 2/2015 | Sakaue | G11C 16/32 714/800 |

FOREIGN PATENT DOCUMENTS

JP   2012-054715 A   3/2012

* cited by examiner

*Primary Examiner* — Hoai V Ho
*Assistant Examiner* — Jay Radke
(74) *Attorney, Agent, or Firm* — Carter, DeLucas, Farrell & Schmidt, LLP

(57) ABSTRACT

In a recording apparatus, a generating unit generates a timing signal by delaying a clock signal. A control unit controls so that a predetermined command is output multiple times to a storage device and each piece of data sent by the storage device in response to the multiple predetermined commands is received in accordance with the timing signal having a different delay amount for each of the multiple predetermined commands. A detection unit detects, in order of the delay amounts, a range of the delay amounts of the timing signals for which predetermined data has been successfully received. A setting unit sets, in a case where a plurality of the ranges have been detected by the detection unit, a single delay amount in a single predetermined range among the plurality of ranges, as the delay amount of the timing signal.

11 Claims, 7 Drawing Sheets

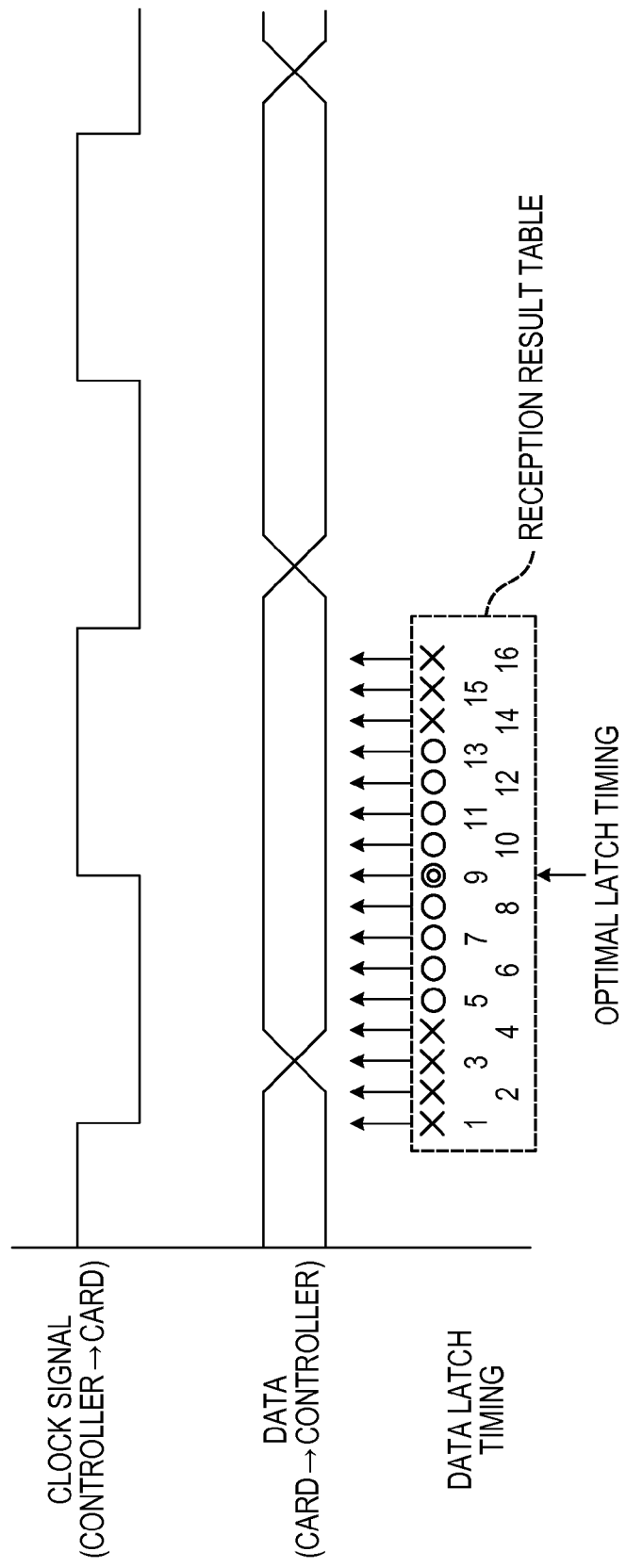

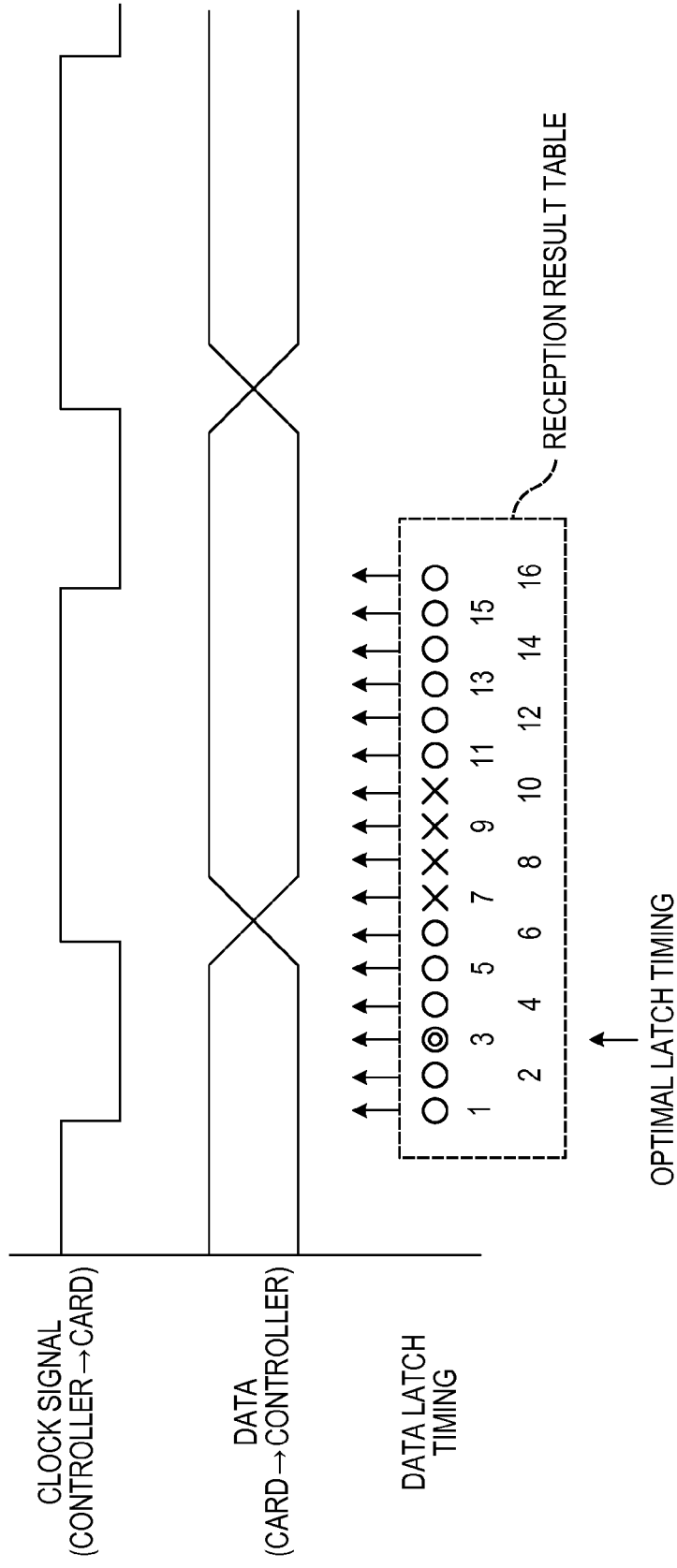

RECORDING APPARATUS AND CONTROL METHOD FOR RECORDING APPARATUS

BACKGROUND OF THE INVENTION

1. Field of the Invention

The present invention relates to a recording apparatus and a control method for a recording apparatus.

2. Description of the Related Art

At present, there are apparatuses that write image data, audio data, and so on into a recording medium such as a memory card or read out and play back data recorded into a recording medium. The reading and writing of data between an apparatus to which a recording medium is connected (a host apparatus) and the recording medium is carried out based on a clock signal generated by the host apparatus. The data to be written or read is sent/received, or a response to a command is received, after the host apparatus sends a single clock pulse of the clock signal. The clock pulse and the data, the response, or the like are thus not necessarily sent/received in perfect synchronization. For example, in the case where the host apparatus reads out data from a recording medium such as an SD memory card, there is delay, equivalent to a standardized fixed value, from when the host apparatus supplies the clock pulse to the recording medium to when the data is actually sent. Accordingly, the host apparatus obtains the data sent from the recording medium by latching the data sent from the recording medium at a timing delayed from the sending of the clock pulse by an amount equivalent to the fixed value.

Recent years have seen increases in data rates for reading and writing from and to such recording media, making it necessary to accelerate the sending of clock pulses, and it has thus become difficult to use fixed values to define amounts of delay from clock pulses for obtaining data. Meanwhile, UHS-I (Ultra High Speed-I), which is a high-speed standard for SD memory cards, defines reading out data after adjusting the timing of the data latch on a card-by-card basis, when reading out data using a high-speed clock. Adjusting the latch timing in this manner is called "tuning" (see Japanese Patent Laid-Open No. 2012-54715, for example).

In the tuning process, the host apparatus varies the clock phase (delay amount) and determines whether or not the correct data has been read out from the recording medium at each phase, and then selects the optimal phase as the latch timing based on the determination result for each phase.

However, there have been cases where the phases in which the correct data is read out are spread over a plurality of ranges, due to the capabilities or changes in temperature of the delay element that varies the clock phase, or individual differences between recording media and so on. In such cases, the host apparatus may select, as the latch timing, a phase that falls within a range that is not necessarily optimal.

SUMMARY OF THE INVENTION

Having been achieved in light of the aforementioned situation, the present invention provides a technique for selecting a more appropriate latch timing in a tuning process.

According to an aspect of the present invention, there is provided a recording apparatus comprising: an output unit configured to output a clock signal to a storage device; a communication unit configured to output a command and data to the storage device in response to the clock signal and receive data from the storage device in response to a timing signal; a generating unit configured to generate the timing signal by delaying the clock signal; a control unit configured to control the communication unit and the generating unit so that a predetermined command instructing predetermined data for adjusting a delay amount of the clock signal to be sent is output multiple times to the storage device and each piece of data sent by the storage device in response to the multiple predetermined commands is received in accordance with the timing signal having a different delay amount for each of the multiple predetermined commands, and configured to determine whether or not the communication unit successfully received the predetermined data in accordance with the respective timing signals having different delay amounts; a detection unit configured to detect, in order of the delay amounts, a range of the delay amounts of the timing signals for which it has been determined that the predetermined data has been successfully received; and a setting unit configured to set, in a case where a plurality of the ranges have been detected by the detection unit, a single delay amount in a single predetermined range among the plurality of ranges, as the delay amount of the timing signal.

According to another aspect of the present invention, there is provided a control method for a recording apparatus including: an output unit configured to output a clock signal to a storage device; a communication unit configured to output a command and data to the storage device in response to the clock signal and receive data from the storage device in response to a timing signal; and a generating unit configured to generate the timing signal by delaying the clock signal, the control method comprising: a control step of controlling the communication unit and the generating unit so that a predetermined command instructing predetermined data for adjusting a delay amount of the clock signal to be sent is output multiple times to the storage device and each piece of data sent by the storage device in response to the multiple predetermined commands is received in accordance with the timing signal having a different delay amount for each of the multiple predetermined commands, and determining whether or not the communication unit successfully received the predetermined data in accordance with the respective timing signals having different delay amounts; a detection step of detecting, in order of the delay amounts, a range of the delay amounts of the timing signals for which it has been determined that the predetermined data has been successfully received; and a setting step of setting, in a case where a plurality of the ranges have been detected by the detection step, a single delay amount in a single predetermined range among the plurality of ranges, as the delay amount of the timing signal.

Further features of the present invention will become apparent from the following description of exemplary embodiments with reference to the attached drawings.

BRIEF DESCRIPTION OF THE DRAWINGS

FIG. 3 is a conceptual diagram illustrating a tuning process executed by the memory card controller 113 (in the case where there is a single successful reception area).

FIG. 7 is a conceptual diagram illustrating a tuning process executed by the memory card controller 113 (in the case where there are multiple broadest successful reception areas).

DESCRIPTION OF THE EMBODIMENTS

Embodiments of the present invention will now be described with reference to the attached drawings. It should be noted that the technical scope of the present invention is defined by the claims, and is not limited by any of the embodiments described below. In addition, not all combinations of the features described in the embodiments are necessarily required for realizing the present invention.

First Embodiment

Figure 1:
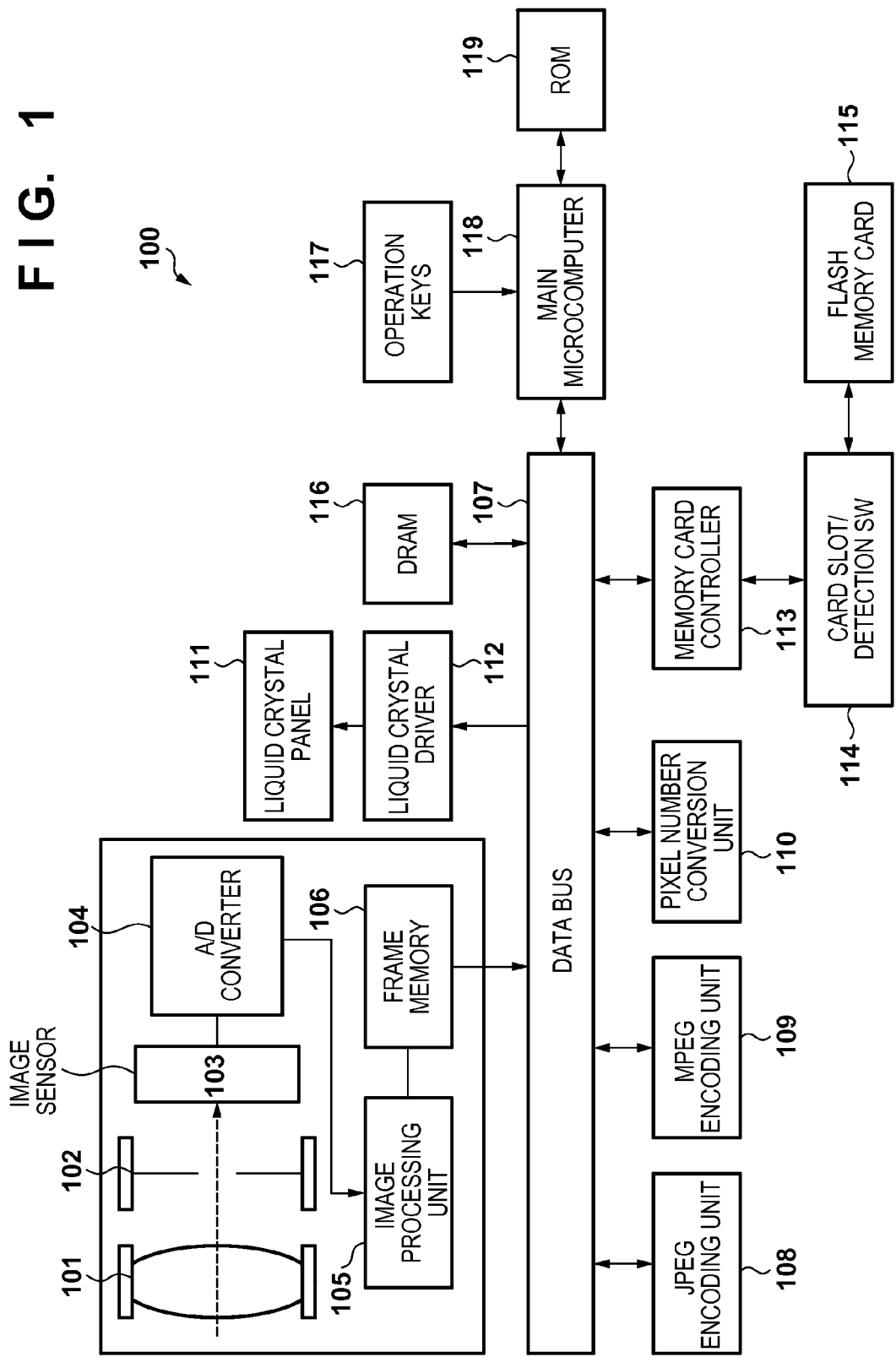
FIG. 1 is a block diagram illustrating an example of the configuration of a digital camera 100 according to a first embodiment.

An embodiment, in which a recording apparatus according to the present invention is applied to an image capturing apparatus such as a digital camera, will be described hereinafter. FIG. 1 is a block diagram illustrating an example of the configuration of a digital camera 100 according to a first embodiment. In FIG. 1, an image capturing lens 101 captures an image of a subject, and the subject image is then formed on an image sensor 103 after a light amount thereof has been restricted to a predetermined amount by an aperture 102. The subject image that has been formed is digitized by an A/D converter 104. The digitized image data undergoes processes such as gamma correction, white balance correction, noise reduction, and the like in an image processing unit 105, and is then output as uncompressed image data to a data bus 107.

A JPEG encoding unit 108 encodes a single frame's worth of the uncompressed image data output from a frame memory 106 in JPEG format so as to reduce the data size thereof, and generates compressed still image data as a result. An MPEG encoding unit 109 encodes uncompressed moving image data output from the frame memory 106 in MPEG format so as to reduce the data size thereof, and generates compressed moving image data as a result.

A liquid crystal panel 111 serves as a display unit for displaying images, various types of information, and so on. A liquid crystal driver 112 converts data for displaying images, stored in a DRAM 116, into a liquid crystal display signal and supplies the signal to the liquid crystal panel 111. Image data for display written into the DRAM 116 is thus displayed by the liquid crystal panel 111 via the liquid crystal driver 112 in this manner. The liquid crystal panel 111 can also function as an electronic viewfinder and display through-the-lens images. In the case where the liquid crystal panel 111 is caused to function as an electronic viewfinder, the liquid crystal driver 112 reduces the resolution of the digital signal obtained from the A/D conversion performed by the A/D converter 104 and stored in the DRAM 116 in accordance with the number of pixels in the liquid crystal panel 111. The liquid crystal driver 112 then converts the digital signal into the liquid crystal display signal and sequentially transfers the signal to the liquid crystal panel 111.

The DRAM 116 provides a buffer memory space for temporarily storing the still image data generated by the JPEG encoding unit 108 or the moving image data generated by the MPEG encoding unit 109. A main microcomputer 118 stores the still image data or the moving image data in the DRAM 116 until the still image data or the moving image data is written into a flash memory card 115 (a recording medium) via a memory card controller 113. The DRAM 116 also provides a work memory space for a pixel number conversion unit 110 that generates thumbnail images used in an index display made when playing back images that have been captured. Furthermore, as described earlier, the DRAM 116 also provides a space that serves as a moving image memory for carrying out displays in the liquid crystal panel 111.

The flash memory card 115 can be attached to/removed from the digital camera 100 via a card slot/detection SW 114. The flash memory card 115 includes, for example, NAND flash memory and a controller, or a communication terminal or the like for transmitting and receiving clock signals, commands, data, and so on with the digital camera 100. The controller of the flash memory card 115 writes and reads data into and from the flash memory in response to commands from the digital camera 100. The controller of the flash memory card 115 generates responses to commands from the digital camera 100 and sends those responses to the digital camera 100 in synchronization with the clock signal from the digital camera 100. Furthermore, in the case where the digital camera 100 has sent a command requesting the sending of test data for the purpose of tuning, the controller of the flash memory card 115 sends the test data to the digital camera 100, as will be described later. The flash memory card 115 records data in a format compliant with the FAT (File Allocation Table) filesystem, for example.

The memory card controller 113 controls the flash memory card 115 and records data from the DRAM 116 into the flash memory card 115. The memory card controller 113 also reads out data from the flash memory card 115 and transfers the data to the DRAM 116. The card slot/detection SW 114 is a slot for mounting the flash memory card 115, and includes a detection SW (switch) for detecting whether or not a card is mounted in the slot.

Operation keys 117 correspond to various types of switches for accepting various types of operations from a user, and include a shutter button for executing an operation for shooting a still image, a trigger button for instructing the recording of moving image to start and stop, and a mode switch for toggling between a camera shooting mode and a playback mode.

A ROM 119 is a non-volatile memory capable of being electrically erased and recorded to, and stores operational constants, programs, and the like for the main microcomputer 118. "Programs" as mentioned here refers to programs for executing various types of sequences, described later, according to the present embodiment, and these programs realize the respective operations of the present embodiment as described later.

The main microcomputer 118 includes a CPU that operates in accordance with the programs stored in the ROM 119. The main microcomputer 118 carries out display control by controlling the liquid crystal driver 112 and the like. Furthermore, in the present embodiment, the main microcomputer 118 uses a tuning pattern signal having the same pattern as a pattern stored in the flash memory card 115 to carry out operations for determining the success/failure of a test pattern and for setting an optimal latch timing, which will be mentioned later.

Figure 2A:
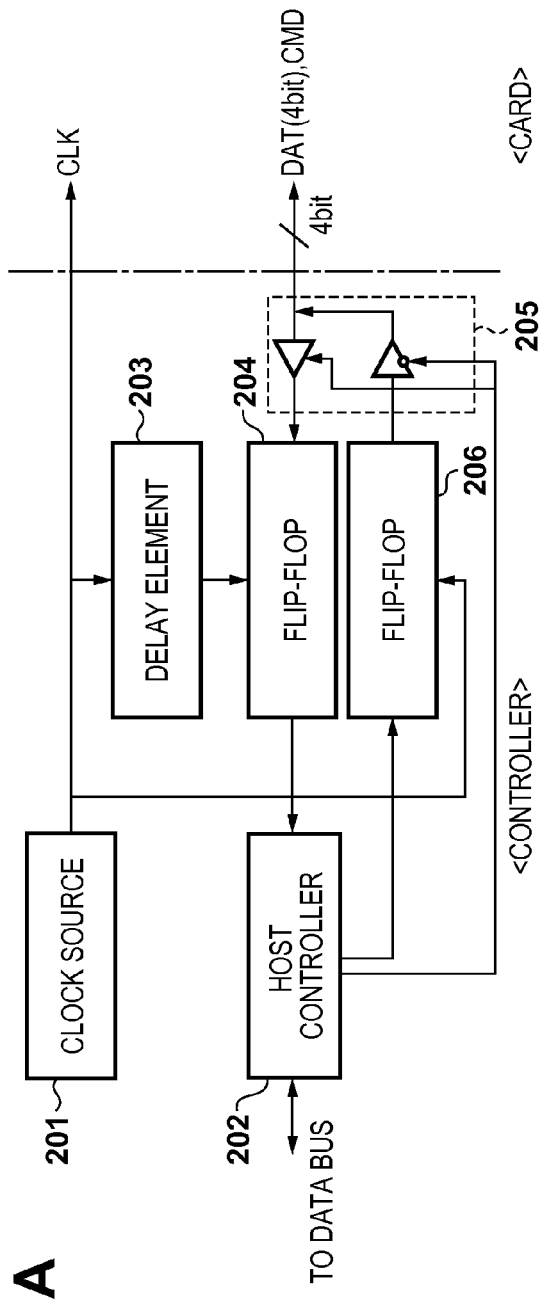
FIG. 2A is a block diagram illustrating a memory card controller 113 in detail.

FIG. 2A is a block diagram illustrating the memory card controller 113 in detail. When data is written into and read out from the flash memory card 115, the memory card controller 113 sends and receives (communicates) signals and data via a CLK line, a CMD line, and a DAT line. Specifically, a clock source 201 outputs, via the CLK line, a clock signal (CLK signal) configured of clock pulses, which is used to control the timing of reading and writing. A host controller 202 outputs command signals for reading and writing, and receives response signals from the flash memory card 115 in response to commands, via the CMD line. The host controller 202 also controls the sending and receiving of data to be written into the flash memory card 115 or data to be read out from the flash memory card 115 via the DAT line.

When reading and writing data, the clock pulses and the sending/receiving of the data occur at different timings, as mentioned earlier. Accordingly, a delay element 203 delays the phase of the clock signal under the control of the main microcomputer 118 when, for example, data is read out from the flash memory card 115, and generates a timing signal for latching the data output from the flash memory card 115. A flip-flop 204 latches the data output from the flash memory card 115 in accordance with the timing signal output from the delay element 203. In other words, the timing signal defines the timing at which the data is latched. Meanwhile, a flip-flop 206 latches the data sent from the host controller 202 to the flash memory card 115 in accordance with the timing provided by the clock source 201. Note that switching between the CMD line and the DAT line depending on whether commands are input/output or data is exchanged is carried out using a signal branching unit 205.

Figure 2B:
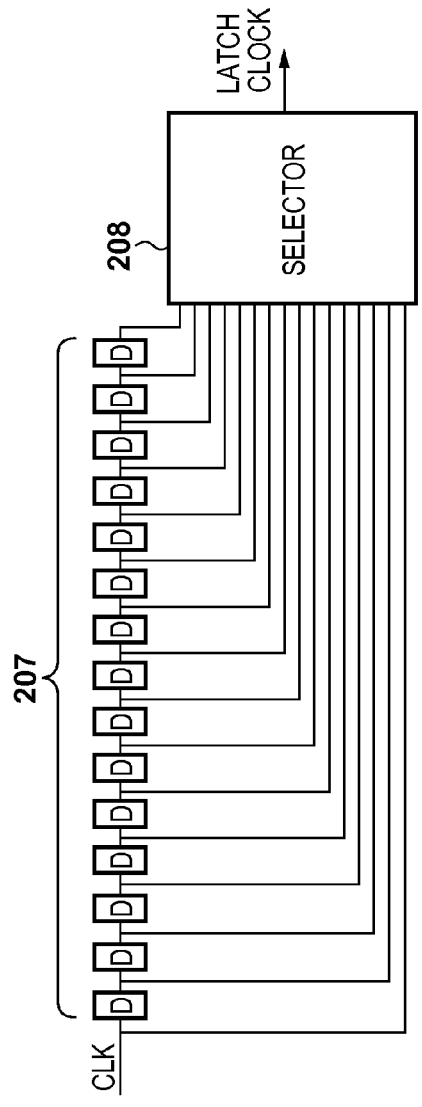
FIG. 2B is a diagram illustrating the internal configuration of a delay element 203.

Furthermore, the internal configuration of the delay element 203 will be described using FIG. 2B. The delay element 203 is configured of a predetermined number of delay circuits 207 connected in series and a selector 208 that selects a single output among the output of the clock source 201 and the outputs of the respective delay circuits 207. The present embodiment describes the delay element 203 as having 15 delay circuits 207, with the delay stage number being variable among 16 stages. Each delay circuit 207 delays the clock signal output by the clock source 201 or the clock signal output from the immediately-previous delay circuit 207 by a predetermined amount of time. In the present embodiment, it is assumed that a delay amount in each delay circuit 207 is a period that is 1/16 the cycle of the clock pulse output from the clock source 201, and that a delay amount equal to a single cycle of the clock pulse is thus achieved by all of the delay circuits 207 delaying the signal. In response to an instruction from the main microcomputer 118, the selector 208 outputs, as an operating clock (latch clock) of the flip-flop 204, the clock signal output from one of the clock source 201 and the delay circuits 207. Thus the delay amount of the operating clock of the flip-flop 204 can be adjusted by changing the clock signal selected by the selector 208.

Next, tuning operations according to the present embodiment will be described briefly with reference to FIGS. 1 to 3. The memory card controller 113 issues a test data send command to the flash memory card 115. In response, the flash memory card 115 sends a 64-byte data string having a predetermined pattern (that is, test data) in synchronization with the clock signal sent from the clock source 201. The memory card controller 113 receives the test data sent from the flash memory card 115 at a latch timing generated by the clock source 201. Here, a phase relationship between the clock signal and the latch timing can be varied by varying the value of the delay stage number set in the delay element 203 (that is, by varying the target of the selection performed by the selector 208). As described earlier, in the present embodiment, the delay element 203 has the 15 delay circuits 207, and thus the latch timing can be selected in 16 steps relative to a single cycle of the clock signal, as shown in FIG. 3. The main microcomputer 118 sends a test data send command multiple times and determines whether the test data was successfully received while varying the phase relationship (that is, using a different latch timing each time) (see the reception result table shown in FIG. 3). The determination as to whether or not the reception is successful is carried out by comparing the data received from the recording medium with the test data. The main microcomputer 118 then selects the latch timing at which the test data reception succeeds in the most stable manner. In this manner, the main microcomputer 118 carries out a tuning process for setting an appropriate latch timing (that is, a process for adjusting the amount of delay of the timing signal) (see the optimal latch timing in FIG. 3).

Figure 4:
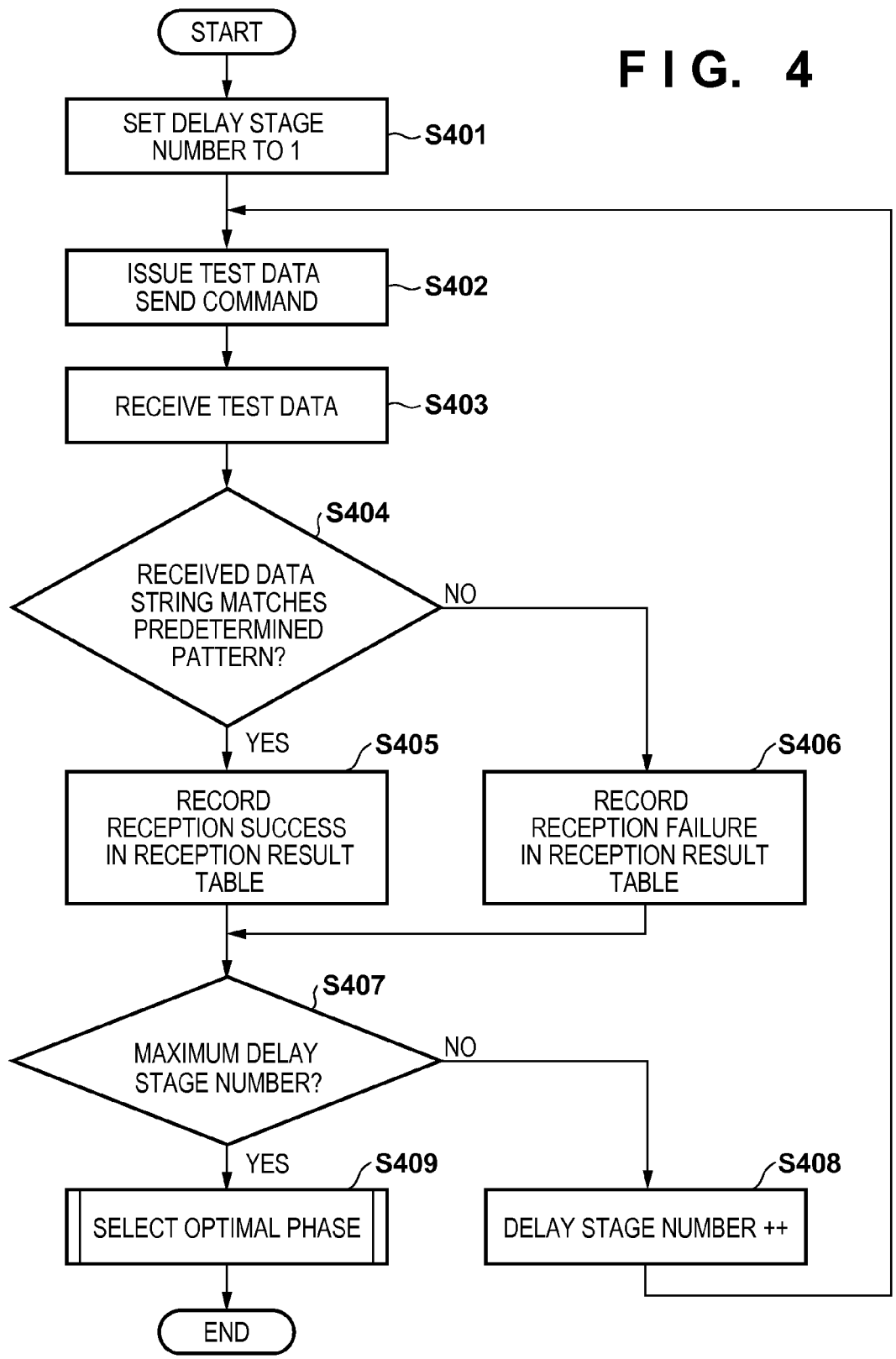
FIG. 4 is a flowchart illustrating a tuning process executed by the memory card controller 113.

Next, tuning operations according to the present embodiment will be described in detail with reference to FIG. 4. FIG. 4 is a flowchart illustrating a tuning process executed by the memory card controller 113. In the present embodiment, the tuning process is executed at predetermined timings, such as when the flash memory card 115 is mounted, when the digital camera 100 is turned on, and so on. Unless otherwise specified, the processes in each step of this flowchart are executed by the main microcomputer 118 controlling the various units in the digital camera 100.

In step S401, the main microcomputer 118 causes the clock source 201 of the memory card controller 113 to start sending the clock signal. The main microcomputer 118 also sets the delay stage number (of 16 stages) of the clock signal in the delay element 203 to "1".

In step S402, the main microcomputer 118 instructs the host controller 202 to send the test data send command to the flash memory card 115, for causing the flash memory card 115 to send the test data. In response to the instruction, the host controller 202 sends the test data send command to the flash memory card 115 via the CMD line. Then, in response to the test data send command, the flash memory card 115 sends the test data in synchronization with the clock signal received from the memory card controller 113.

In step S403, the flip-flop 204 latches the data received from the flash memory card 115 via the DAT line at a latch timing determined by the timing signal supplied from the delay element 203. The timing signal supplied by the delay element 203 is generated by the delay element 203 delaying the clock signal based on the delay stage number currently set.

In step S404, the main microcomputer 118 determines whether or not the data string received by the flip-flop 204 matches a predetermined pattern. The process moves to step S405 in the case where the main microcomputer 118 determines that the received data string matches the predetermined pattern, and moves to step S406 in the case where the main microcomputer 118 determines that the received data string does not match the predetermined pattern.

In step S405, the main microcomputer 118 records information of a reception success in, for example, a reception result table stored in the DRAM 116, in association with the current delay stage number. On the other hand, in the case where it is determined in step S404 that the received data string does not match the predetermined pattern, the main microcomputer 118 records information of a failed reception in the reception result table in step S406, in association with the current delay stage number.

In step S407, the main microcomputer 118 determines whether or not the delay stage number set in the delay element 203 is a maximum delay stage number (16, in the present embodiment). In the case where the main microcomputer 118 determines that the delay stage number set in the delay element 203 is not the maximum delay stage number, the next-higher delay stage number is set in the delay element 203 in step S408, and the process returns to step S402. On the other hand, in the case where the main microcomputer 118 determines that the delay stage number set in the delay element 203 is the maximum delay stage number, the process moves to step S409.

In step S409, the main microcomputer 118 refers to the reception result table stored in the DRAM 116, selects the optimal delay stage number (optimal phase), and sets the selected delay stage number in the delay element 203. This completes the tuning of the latch timing.

Figure 5:
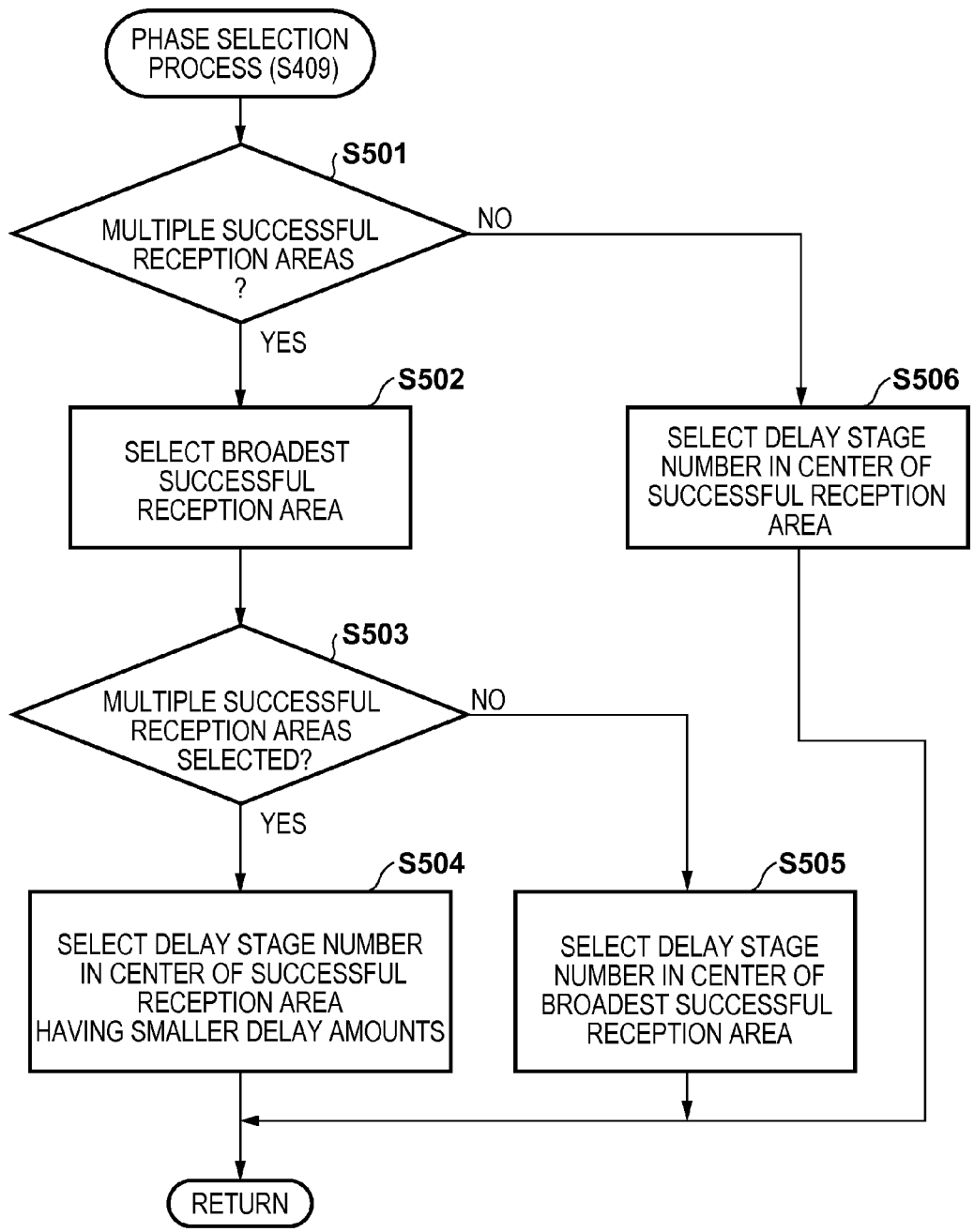
FIG. 5 is a flowchart illustrating details of a phase selection process performed in step S409.

FIG. 5 is a flowchart illustrating details of the phase selection process in step S409. In step S501, the main microcomputer 118 refers to the reception result table stored in the DRAM 116, detects an area in which multiple reception successes continue sequentially (a successful reception area) and determines whether or not there are multiple successful reception areas.

Figure 6:
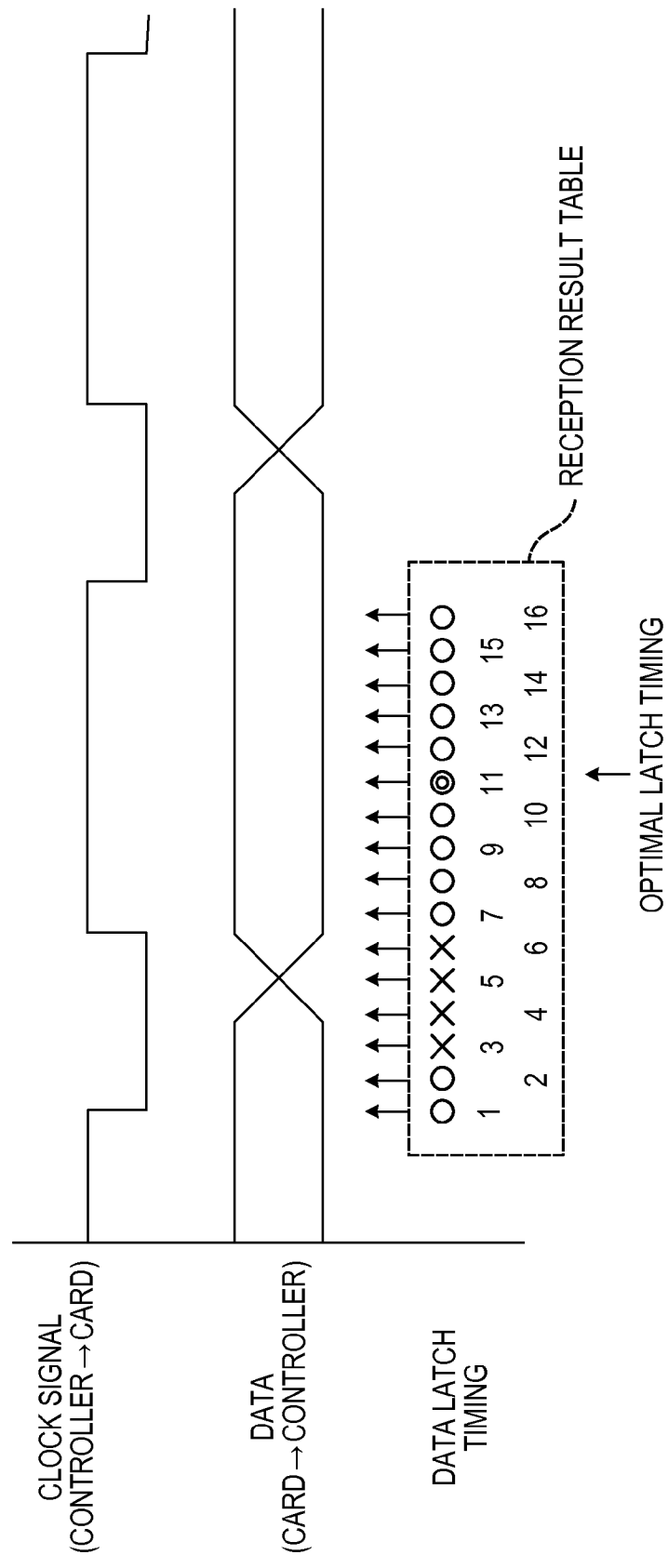
FIG. 6 is a conceptual diagram illustrating a tuning process executed by the memory card controller 113 (in the case where there are multiple successful reception areas).

The successful reception area will be described next with reference to FIGS. 3, 6, and 7. FIG. 3 illustrates examples of the clock signal output from the memory card controller 113, data received from the flash memory card 115, and the reception result table. In FIG. 3, numbers 1 to 16 in the reception result table indicate the delay stage numbers in the delay element 203, and ○ and x indicate a reception success and a reception failure, respectively. A range (area) from delay stage numbers 5 to 13 is a reception success in FIG. 3, whereas ranges from delay stage numbers 1 to 4 and 14 to 16 are reception failures. Accordingly, in the example shown in FIG. 3, the range (area) from delay stage numbers 5 to 13 is the successful reception area, of which there is one. Meanwhile, there are cases where differences in delay amounts between clock signals and return data caused by individual differences between cards, variations in delay amounts due to temperature characteristics of the delay element 203, and so on result in multiple successful reception areas as shown in FIGS. 6 and 7, rather than a single successful reception area as shown in FIG. 3. In the example shown in FIG. 6, there are two successful reception areas, corresponding to delay stage numbers 1 to 2 and delay stage numbers 7 to 16, whereas in the example shown in FIG. 7, there are two successful reception areas, corresponding to delay stage numbers 1 to 6 and delay stage numbers 11 to 16.

In the case where there are multiple successful reception areas as in FIGS. 6 and 7, the process moves to step S502, whereas in the case where there is only one successful reception area as in FIG. 3, the process moves to step S506.

In step S502, the main microcomputer 118 selects the broadest of the multiple successful reception areas. In the case where there are multiple broadest successful reception areas as in FIG. 7, all of the broadest successful reception areas are selected.

In step S503, the main microcomputer 118 determines whether or not multiple successful reception areas have been selected in step S502. In the case where multiple successful reception areas have been selected, the process moves to step S504, whereas when such is not the case, the process moves to step S505.

In step S504, the main microcomputer 118 selects, of the multiple successful reception areas that have been selected, the delay stage number that is in the center of the successful reception area having the lower delay stage number of the delay element 203, and sets the selected delay stage number in the delay element 203. Through this, the main microcomputer 118 can select the lower delay stage number. Generally speaking, the delay amount per stage of the delay element 203 varies depending on the temperature, and thus selecting the lower delay stage number makes it possible to select a delay stage number (that is, a latch timing) less susceptible to the influence of subsequent changes in temperature. In the example shown in FIG. 7, the breadth of the successful reception area corresponding to delay stage numbers 1 to 6 is the same as the breadth of the successful reception area corresponding to delay stage numbers 11 to 16, but there is a lower delay stage number in the former. Meanwhile, there is an even number of delay stages in the successful reception area corresponding to delay stage numbers 1 to 6, and the center of this successful reception area is between delay stage numbers 3 and 4. In such a case, of the delay stage numbers 3 and 4 that are closest to the center, the delay stage number 3, whose delay amount is smaller, is selected as the delay stage number to be set in the delay element 203.

Note that the delay stage number selected in step S504 does not necessarily have to be the delay stage number in the center, as long as the delay stage number is present in the successful reception area having the lower delay stage number of the delay element 203. In other words, the main microcomputer 118 may select a single delay stage number among the multiple delay stage numbers corresponding to the successful reception area having the lower delay stage number of the delay element 203.

Meanwhile, when selecting the broadest successful reception area in step S502, the main microcomputer 118 may also select, as the broadest successful reception area, a successful reception area that is slightly narrower than the broadest successful reception area. Specifically, the main microcomputer 118 determines, for example, whether or not a difference between the breadth of the broadest successful reception area and the breadth of another successful reception area is less than or equal to a threshold (a threshold δ), and selects a successful reception area for which the difference is less than or equal to the threshold δ as the broadest successful reception area. The threshold δ is, for example, proportional to the breadth of the actual broadest successful reception area, and is 10% of that breadth, for example. However, the threshold may be any value that serves as an indicator indicating whether or not there is a meaningful difference between the breadths of the successful reception areas.

In step S505, the main microcomputer 118 selects the delay stage number in the center of the single successful reception area selected in step S502 (that is, the broadest successful reception area), and sets that delay stage number in the delay element 203. In the example shown in FIG. 6, the successful reception area corresponding to delay stage numbers 7 to 16 is broader than the successful reception area corresponding to delay stage numbers 1 to 2. Meanwhile, there is an even number of delay stages in the successful reception area corresponding to delay stage numbers 7 to 16, and the center of this successful reception area is between delay stage numbers 11 and 12. In such a case, of the delay stage numbers 11 and 12 that are closest to the center, the delay stage number 11 whose delay amount is smaller is selected as the delay stage number to be set in the delay element 203.

Note that the delay stage number selected in step S505 does not necessarily have to be the delay stage number in the center, as long as the delay stage number is present in the single selected successful reception area (that is, the broadest successful reception area). In other words, the main microcomputer 118 may select a single delay stage number among the multiple delay stage numbers corresponding to the broadest successful reception area.

In the case where only one successful reception area is present in step S501, in step S506, the main microcomputer 118 selects the delay stage number in the center of the successful reception area and sets that delay stage number in the delay element 203. In the example shown in FIG. 3, the delay stage number 9 is selected as the delay stage number to be set in the delay element 203.

Note that the delay stage number selected in step S506 does not necessarily have to be the delay stage number in the center, as long as the delay stage number is present in the successful reception area. In other words, the main microcomputer 118 may select a single delay stage number among the multiple delay stage numbers corresponding to the successful reception area.

As described thus far, according to the present embodiment, the digital camera 100 determines whether or not multiple successful reception areas are present in the recording medium tuning process. In the case where multiple successful reception areas are present, the digital camera 100 selects the delay stage number (phase) in the center of the broadest successful reception area. In the case where multiple broadest successful reception areas are present, the digital camera 100 selects the delay stage number in the center of the successful reception area having a lower delay stage number.

Through this, a more appropriate latch timing can be selected in the tuning process.

Other Embodiments

Embodiments of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiments and/or that includes one or more circuits (e.g., application specific integrated circuit (ASIC)) for performing the functions of one or more of the above-described embodiments, and by a method performed by the computer of the system or apparatus by, for example, reading out and executing the computer executable instructions from the storage medium to perform the functions of one or more of the above-described embodiments and/or controlling the one or more circuits to perform the functions of one or more of the above-described embodiments. The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-012763, filed Jan. 27, 2014 which is hereby incorporated by reference herein in its entirety.

What is claimed is:

1. A recording apparatus comprising:
an output unit configured to output a clock signal to a storage device;
a communication unit configured to output a command and data to the storage device in response to the clock signal and receive data from the storage device in response to a timing signal;
a generating unit configured to generate the timing signal by delaying the clock signal;
a control unit configured to control the communication unit and the generating unit so that a predetermined command instructing predetermined data for adjusting a delay amount of the clock signal to be sent is output multiple times to the storage device and each piece of data sent by the storage device in response to the multiple predetermined commands is received in accordance with the timing signal having a different delay amount for each of the multiple predetermined commands, and configured to determine whether or not the communication unit successfully received the predetermined data in accordance with the respective timing signals having different delay amounts;
a detection unit configured to detect, in order of the delay amounts, a range of the delay amounts of the timing signals for which it has been determined that the predetermined data has been successfully received; and
a setting unit configured to set, in a case where a plurality of the ranges have been detected by the detection unit, a single delay amount in a single predetermined range among the plurality of ranges, as the delay amount of the timing signal.

2. The apparatus according to claim 1,
wherein the setting unit sets, as the delay amount of the timing signal, a single delay amount in a broadest range among the plurality of ranges.

3. The apparatus according to claim 2,
wherein in a case where there is a plurality of the broadest ranges among the plurality of ranges, the setting unit sets, as the delay amount of the timing signal, a single delay amount in a range that corresponds to smaller delay amounts, among the plurality of broadest ranges.

4. The apparatus according to claim 2,
wherein in a case where a range having a breadth that is different from a breadth of the broadest range by less than or equal to a threshold is present in the plurality of ranges, the setting unit sets, as the delay amount of the timing signal, a single delay amount in a range that corresponds to smaller delay amounts, among the broadest range and the range having the breadth that is different from the breadth of the broadest range by less than or equal to the threshold.

5. The apparatus according to claim 4,
wherein the threshold is proportional to the breadth of the broadest range.

6. The apparatus according to claim 1,
wherein in a case where a single range has been detected by the detection unit, the setting unit sets, as the delay amount of the timing signal, a single delay amount in the single range.

7. The apparatus according to claim 1,
wherein the setting unit sets, as the delay amount of the timing signal, a delay amount corresponding to a center of the predetermined single range.

8. The apparatus according to claim 7,
wherein in a case where there is an even number of delay amounts corresponding to the predetermined single range, the setting unit sets, as the delay amount of the timing signal, the smaller of two delay amounts closest to the center of the predetermined single range.

9. The apparatus according to claim 1, further comprising:

an image capturing unit, wherein the control unit controls the communication unit to output, to the storage device, a command for writing image data obtained by the image capturing unit into the storage device and the image data.

10. The apparatus according to claim 1, wherein in a case where the data received by the communication unit in accordance with the respective timing signals having different delay amounts matches the predetermined data, the control unit determines that the predetermined data has been successfully received.

11. A control method for a recording apparatus including:

an output unit configured to output a clock signal to a storage device;

a communication unit configured to output a command and data to the storage device in response to the clock signal and receive data from the storage device in response to a timing signal; and a generating unit configured to generate the timing signal by delaying the clock signal, the control method comprising:

a control step of controlling the communication unit and the generating unit so that a predetermined command instructing predetermined data for adjusting a delay amount of the clock signal to be sent is output multiple times to the storage device and each piece of data sent by the storage device in response to the multiple predetermined commands is received in accordance with the timing signal having a different delay amount for each of the multiple predetermined commands, and determining whether or not the communication unit successfully received the predetermined data in accordance with the respective timing signals having different delay amounts;

a detection step of detecting, in order of the delay amounts, a range of the delay amounts of the timing signals for which it has been determined that the predetermined data has been successfully received; and a setting step of setting, in a case where a plurality of the ranges have been detected by the detection step, a single delay amount in a single predetermined range among the plurality of ranges, as the delay amount of the timing signal.

* * * * *